United States Patent [19]

Confalonieri et al.

[11] Patent Number: 5,070,305
[45] Date of Patent: Dec. 3, 1991

[54] DEVICE FOR CONVERTING UNBALANCED ANALOG ELECTRIC SIGNALS INTO FULLY DIFFERENTIAL SIGNALS

[75] Inventors: Pierangelo Confalonieri, Canonica d'Adda; Germano Nicollini, Piacenza, both of Italy

[73] Assignee: Thomson Microelectronics S. R. L., Agrate Brianza, Italy

[21] Appl. No.: 560,428

[22] Filed: Jul. 31, 1990

[30] Foreign Application Priority Data

Aug. 25, 1989 [IT] Italy .............................. 21553 A/89

[51] Int. Cl.[5] .............................................. H03F 3/45
[52] U.S. Cl. .................................. 330/69; 330/148; 330/260; 330/301
[58] Field of Search .............. 330/84, 69, 146, 148, 330/260, 275, 301

[56] References Cited

U.S. PATENT DOCUMENTS 4,723,112  2/1988  Diller et al. ..................... 330/260 X

OTHER PUBLICATIONS

Martin, "Improved Circuits for the Realization of Switched Capacitor Filters", *Proceedings of the 1979 International Symposium on Circuits and Systems*, Tokyo, Japan, Jul. 17-19, 1979, pp. 756-759.

Primary Examiner—James B. Mullins
Attorney, Agent, or Firm—Wolf, Greenfield & Sacks

[57] ABSTRACT

An all-differential operational amplifier (20) has a first input (22) and a second input (24) and correspondingly has a first output (26) and a second output (28), fed back on its own input respectively through a first (34) and second (36) impedance which are generally resistive and have identical values. The first output is connected to the second input of the operational amplifier across a third impedance (32). A fourth impedance (30), equal in value to the third impedance, is connected in series to the first input and acts as input terminal of the converter. The resistive components of the impedance can be implemented as switched capacitors.

21 Claims, 2 Drawing Sheets

DEVICE FOR CONVERTING UNBALANCED ANALOG ELECTRIC SIGNALS INTO FULLY DIFFERENTIAL SIGNALS

BACKGROUND OF THE INVENTION

1. Field of the invention

The present invention relates to a device for converting unbalanced analog electric signals into fully-differential signals for use in analog signal processing circuits.

2. Description of the Prior Art

Fully differential signals have been preferred in processing analog signals because of several advantages, including, above all, insensitivity to power supply noise and/or ground noise, digital signal noise, etc. This insensitivity is due to the fact that said noise is converted only in the common mode and are therefore not perceived in the differential signal.

In many cases, however, the input signal is unbalanced, or single-ended, and it is therefore necessary to initially convert it into a fully-differential (or balanced) signal. However, converters used so far for this purpose, as will be described in greater detail hereinafter, are vulnerable to noise from the power supply or from the circuit ground, which in many cases does not coincide with the signal ground. Other types of noise to which said converters are vulnerable are also digital signals, or of other types, which couple capacitively at high frequency. In any case, alterations of the signal are thus introduced from the beginning, and once said alterations are superimposed they can no longer be eliminated, even if the successive structure is balanced.

SUMMARY OF THE INVENTION

The aim of the invention is therefore to provide a device, for converting unbalanced analog signals into fully-differential signals, which is not affected by the above described noise.

The invention achieves this aim and other objects and advantages, as will become apparent from the following description, by means of a device for converting unbalanced analog electric signals into fully-differential balanced signals, comprising a fully-differential operational amplifier having a first imput and a second input and correspondingly a first output and a second output, each of said outputs being fed back to said corresponding input respectively through a first impedance and a second impedance of identical value, said first output being connected to said second input of said operational amplifier through a third impedance, while a fourth impedance, equal in value to said third impedance, is connected in series to said first input.

BRIEF DESCRIPTION OF THE DRAWINGS

The invention will be now described in greater detail with reference to some preferred embodiments, shown in the accompanying drawings, which are given by way of non-limitative example, and wherein.

DESCRIPTION OF THE PREFERRED EMBODIMENTS OF THE INVENTION

Figure 1:
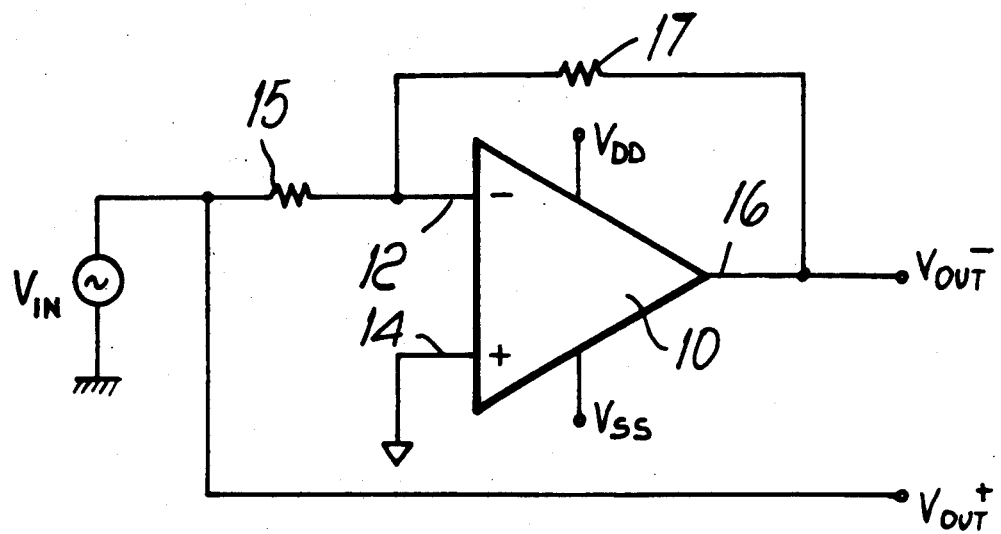
FIG. 1 is a circuit diagram of an unbalanced to balanced converter according to the prior art.

With reference to FIG. 1, a device for converting unbalanced analog signals to balanced signals (from single-ended to differential) typically used in the prior art comprises a conventional unbalanced operational amplifier 10 which is fed with symmetrical voltages $V_{DD}$ and $V_{SS}$ and has an inverting input 12, a non-inverting input 14 and an output 16. The non-inverting input 14 is connected to the ground, whereas the analog signal $V_{in}$ (which is single-ended) is applied to the inverting input 12 across a resistor 15 which has a value $R_1$. A second resistor 17, having a value $R_2$ which is generally equal to $R_1$, is connected in negative feedback between the output terminal 16 of the amplifier 10 and its inverting input 12. The singal $V_{in}$ is furthermore sent directly to an output terminal 18 of the converter. The result is that $$V_{out}+ = V_{in}$$

and the man of the art straightforwardly obtains:

$$V_{out}- = = -V_{in}$$

assuming that the operational amplifier is an ideal one and therefore has infinite gain.

While $V_{out}+$ is clean, $V_{out}-$ is deteriorated by the operational amplifier 10 ground noise, which reaches the output multiplied by $1+R_2/R_1$, and by the noise of the power supplies $V_{DD}$ and $V_{SS}$. Said ground is in fact internal to the circuit and, unlike the external one, is therefore deteriorated, as pointed out by the different symbols used in the figures.

Figure 2:
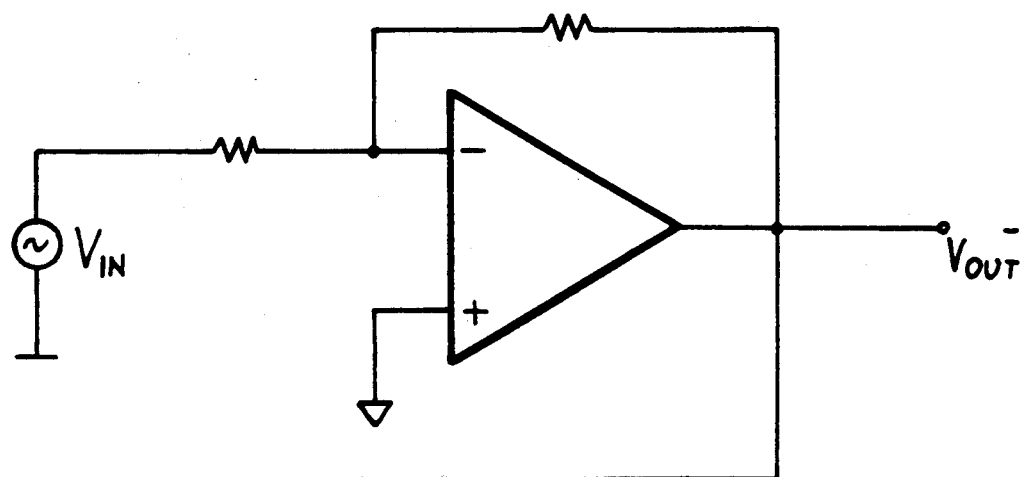
FIG. 2 is a circuit diagram of another unbalanced to balanced converter according to the prior art.
Figure 2:
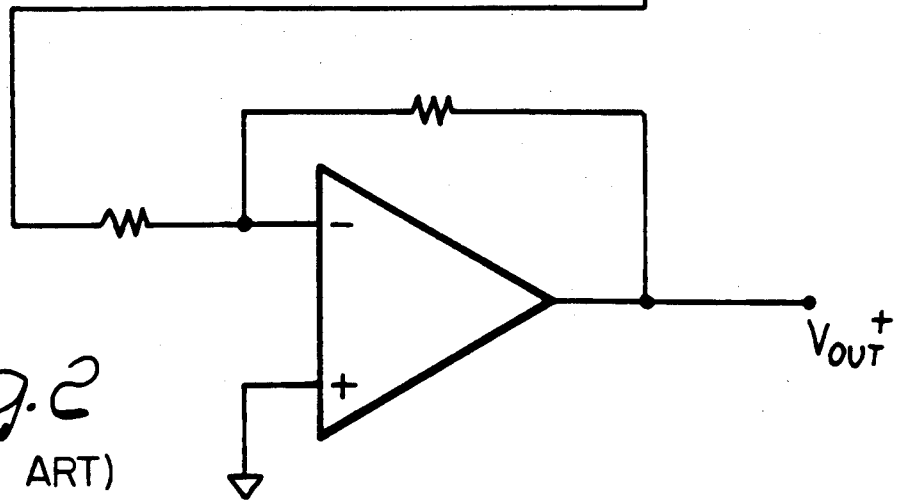

The converter of FIG. 2, which is also known, is formed by two of the circuits of FIG. 1 arranged in cascade, and therefore has similar disadvantages, as it is apparent to the man of the art.

Figure 3:
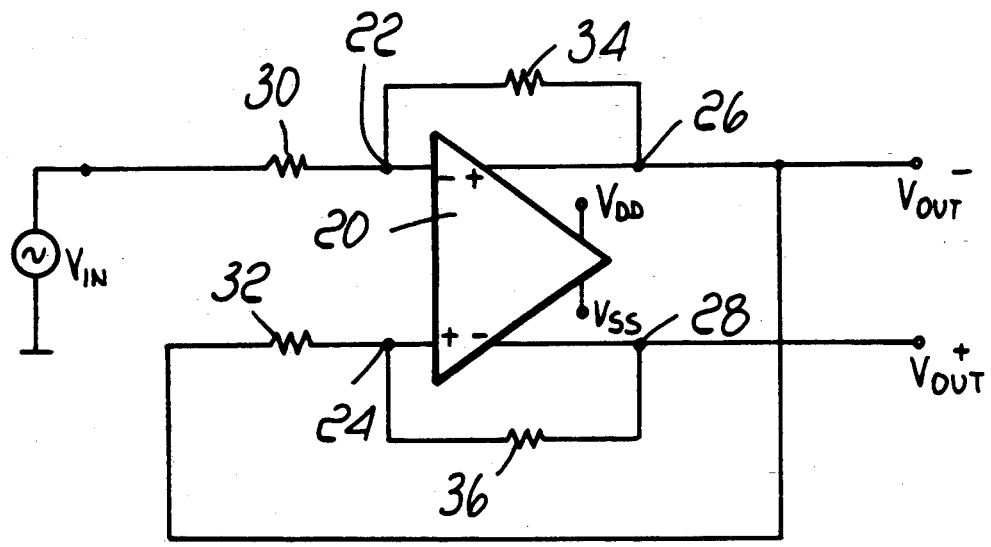
FIG. 3 is a circuit diagram of an unbalanced to balanced converter according to a first embodiment of the invention.

FIG. 3 shows a first preferred embodiment of an unbalanced to balanced converter according to the invention, wherein a fully-differential operational amplifier 20, fed by voltages $V_{DD}$ and $V_{SS}$, has a first input 22 and a second input 24 with respective outputs 26 and 28. The unbalanced input signal $V_{in}$ is applied to the first input 22 through a resistor 30 which has a value $R_1$, and the output terminal 26 is connected to the second input 24 through a resistor 32 which has an identical value. Each of the outputs 26, 28 is fed back on the respective input 22, 24 through respective resistors 34, 36 having an identical value $R_2$. Signals $V_{out}+$ and $V_{out}-$ appear on the outputs, and have identical absolute values and opposite signs, in accordance with the theory of fully-differential amplifiers. By writing the current balancing equations for the input nodes of the amplifier 20, the following formula is obtained for the complete transfer function of the circuit (assuming an ideal operational amplifier, i.e. an amplifier with infinite gain and with no zeros or poles in its transfer function):

$$V_{out}/V_{in} = -2R_2/(2R_1 - R_2)$$

Since the transfer function of the circuit in any case contains poles in finite positions of the complex plane, the values $R_1$ and $R_2$ must be chosen so that no pole is located in the half-plane where a positive feedback is greater than the negative feedback. It can be demonstrated that this condition is verified only if $$R_1 > R_2/2$$

By then choosing $R_1 = 1.5\ R_2$, the following is obtained:

$$V_{out}/V_{in} = -1$$

In the described circuit, by virtue of the balanced operational amplifier, any power supply and ground noise, as well as any digital noise, is coupled on the outputs in the common mode only, because of the symmetry of the amplifier, and therefore said noise is not seen differentially.

Figure 4:
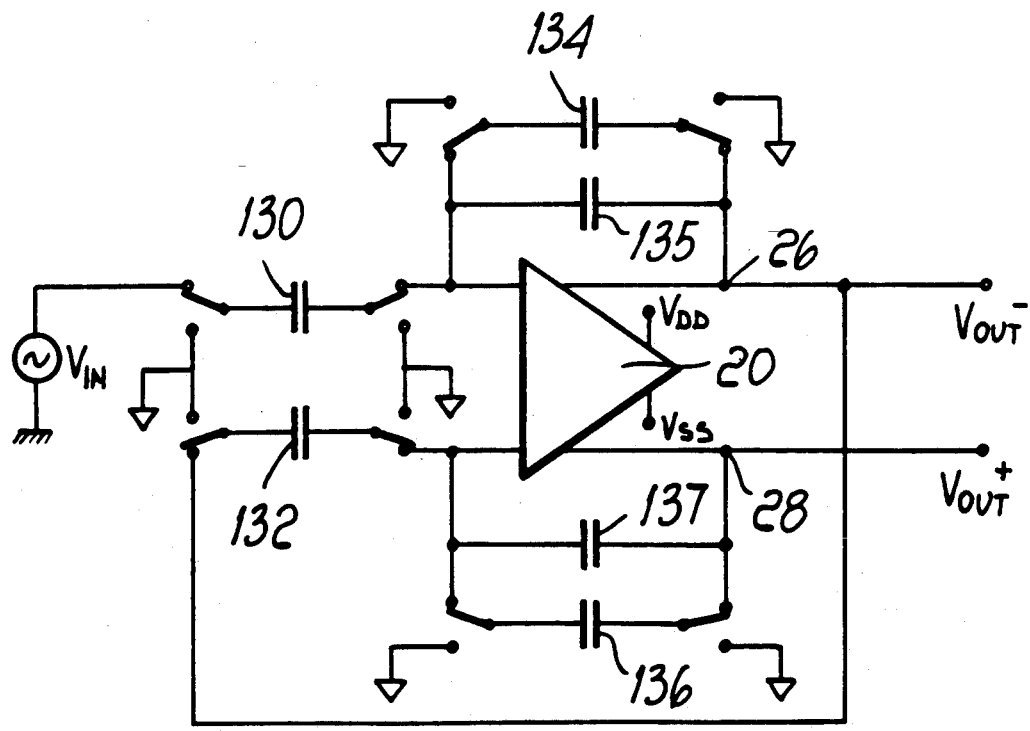
FIG. 4 is a circuit diagram of an unbalanced to balanced converter according to a second embodiment of the invention.

If the analog processing is not continuous but uses the switched-capacitor technique, the invention can be provided using this technique, as illustrated in FIG. 4. Here the resistors 30 and 32 are replaced by switched capacitors 130 and 132, and the resistors 34 and 36 are replaced by switched capacitors 134 and 136 having respective fixed capacitors 135 and 137 arranged in parallel; said fixed capacitors have the purpose of not leaving the operational amplifier in an open loop when the capacitors 134 and 136 are discharged to the ground.

If the capacitors 130, 132, 134 and 136 are switched with a frequency $f_s$, it is known to the man of the art that they are equivalent to resistors with a value $R = 1/f_sC$, where C is the capacity of the capacitor.

The introduction of the fixed capacitors 135 and 137 generates a pole in the transfer function, but said capacitors can be dimensioned so that said pole lies outside the useful frequency range of the input signal.

The term "impedance" is used in the claims to also refer to the equivalent resistor of a switched capacitor.

Some preferred embodiments of the invention have been described, but it is understood that the man of the art can device other modifications and variations which are comprised within the scope of the inventive concept.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

We claim:

1. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output being connected to said second input of said operational amplifier through a third impedance, while a fourth impedance, equal in value to said third impedance, being connected in series to said first input.

2. Converter according to claim 1, wherein said impedances are substantially resistive.

3. Converter according to claim 2, wherein said resistance value of said third and fourth impedances is greater than half of the value of said resistance of said first and second impedances.

4. Converter according to claim 2, characterized in that the resistance value of said third and fourth impedances is equal to 1.5 times the value of the resistance of said first and second impedances.

5. Converter according to claim 1, wherein each of said first and second impedances is constituted by a switched capacitor arranged in parallel to a fixed capacitor, and each of said third and fourth impedances is constituted by a switched capacitor.

6. Converter according to claim 5, wherein the equivalent resistive component of said third and fourth impedances has a value which is greater than half of the value of the equivalent resistive component of said first and second impedances.

7. A device according to claim 6, wherein said switched capacitors of said first and second impedances are connectable to a reference ground line.

8. A device according to claim 5, wherein said switched capacitors of said first and second impedances are connectable to a reference ground line.

9. A device for converting unbalanced analog electric signals into fully-differential, balanced signals, comprising:
a fully differential operational amplifier having a first input, a second input, a first output and a second output;
a first impedance connected from said first output to said first input;
a second impedance connected from said second output to said second input;
a third impedance connected from said first output to said second input;
means for receiving the unbalanced analog electric signal;
a fourth impedance connected from said means for receiving the unbalanced analog electric signal to said first input; and
said first impedance being substantially equal to said second impedance and said third impedance substantially equal to said fourth impedance.

10. A device according to claim 9, wherein said impedances are substantially resistive.

11. A device according to claim 10, wherein said resistance value of said third and fourth impedances is greater than half of the value of said resistance of said first and second impedances.

12. A device according to claim 10, characterized in that the resistance value of said third and fourth impedances is equal to 1.5 times the value of the resistance of said first and second impedances.

13. A device according to claim 9, wherein each of said first and second impedances comprises a switched capacitor arranged in parallel to a fixed capacitor, and each of said third and fourth impedances comprises a switched capacitor.

14. A device according to claim 13, wherein the equivalent resistive component of said third and fourth impedances has a value which is greater than half of the value of the equivalent resistive component of said first and second impedances.

15. A converter according to claim 14, wherein said switched capacitors of said first and said second impedances are connectable to a reference ground line.

16. A converter according to claim 13, wherein said switched capacitors of said first and said second impedances are connectable to a reference ground line.

17. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output connected to said second input of said operational amplifier through a third impedance, and a fourth impedance, equal in value to said third impedance, being connected in series to said first input, wherein said impedances are substantially resistive, and further wherein the resistance value of said third and fourth impedances is greater than half of the value of said resistance of said first and second impedances.

18. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output connected to said second input of said operational amplifier through a third impedance, and a fourth impedance, equal in value to said third impedance, connected in series to said first input, wherein the resistance value of said third and fourth impedances is equal to 1.5 times the value of the resistance of said first and second impedances.

19. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output connected to said second input of said operational amplifier through a third impedance, while a fourth impedance, equal in value to said third impedance, connected in series to said first input, wherein each of said first and second impedances is constituted by a switched capacitor arranged in parallel to a fixed capacitor, and each of said third and fourth impedances is constituted by a switched capacitor, and wherein the equivalent resistive component of said third and fourth impedances has a value which is greater than half of the value of the equivalent resistive component of said first and second impedances.

20. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output connected to said second input of said operational amplifier through a third impedance, and a fourth impedance, equal in value to said third impedance, being connected in series to said first input, a pair of output terminals, and means coupling the respective first and second outputs of said operational amplifier to said output terminals to provide a corresponding plurality of output voltage signals.

21. Device for converting unbalanced analog electric signals into fully-differential balanced signals, comprising a fully-differential operational amplifier having a first input and a second input and correspondingly a first output and a second output, each of said outputs being fed back to said corresponding input respectively through a first impedance and a second impedance of identical value, said first output connected to said second input of said operational amplifier through a third impedance, and a fourth impedance, equal in value to said third impedance, being connected in series to said first input, means for receiving the unbalanced analog electric signal, and means for coupling said unbalanced analog electric signal to only said first input of said operational amplifier.

* * * * *

UNITED STATES PATENT AND TRADEMARK OFFICE
CERTIFICATE OF CORRECTION

PATENT NO. : 5,070,305

DATED : December 3, 1991

INVENTOR(S) : Pierangelo Congalonieri, Germano Nicollini

It is certified that error appears in the above-identified patent and that said Letters Patent is hereby corrected as shown below:

On the title page:

The name of the Assignee on the Patent is incorrect. The correct name of the Assignee is SGS-THOMSON Microelectronics S.r.l., Agrate Brianza (Milano) Italy, a corporation of Italy.

Signed and Sealed this

Eleventh Day of May, 1993

Attest:

MICHAEL K. KIRK

Attesting Officer

Acting Commissioner of Patents and Trademarks